United States Patent [19]

Shibata et al.

[11] Patent Number: 4,547,901
[45] Date of Patent: Oct. 15, 1985

[54] MICROWAVE RECEIVING APPARATUS USING A WAVEGUIDE FILTER

[75] Inventors: Toshio Shibata, Yokohama; Koichiro Sakuma, Tokyo, both of Japan

[73] Assignee: Tokyo Shibaura Denki Kabushiki Kaisha, Kawasaki, Japan

[21] Appl. No.: 552,838

[22] Filed: Nov. 17, 1983

[30] Foreign Application Priority Data

Nov. 30, 1982 [JP] Japan .................... 57-208461

[51] Int. Cl.⁴ ................. H04B 1/10; H04B 1/26
[52] U.S. Cl. .................... 455/300; 455/328; 333/208
[58] Field of Search .......... 455/81, 302, 307, 325–328, 455/300, 301; 333/202, 208, 212, 26

[56] References Cited

U.S. PATENT DOCUMENTS

| | | |
|---|---|---|
| 2,901,709 | 8/1959 | Fitzmorris . |
| 2,976,499 | 3/1961 | Sferrazza . |
| 3,721,921 | 3/1973 | Lamy et al. . |
| 3,859,600 | 1/1975 | Craven et al. ............... 455/302 |
| 4,072,902 | 2/1978 | Knox et al. ................. 455/328 |
| 4,276,655 | 6/1981 | Kraemer et al. ............. 455/327 |
| 4,280,113 | 7/1981 | Sekiguchi ................... 333/212 |
| 4,353,132 | 10/1982 | Saitoh et al. ............... 455/327 |
| 4,418,429 | 11/1983 | Roberts ..................... 455/327 |

FOREIGN PATENT DOCUMENTS

| | | |
|---|---|---|
| 0059927 | 3/1982 | European Pat. Off. . |
| 0094047 | 11/1983 | European Pat. Off. . |
| 71916 | 6/1979 | Japan ....................... 455/328 |
| 5827401 | 8/1981 | Japan . |

OTHER PUBLICATIONS

Patents Abstracts of Japan, vol. 1, No. 72 (Jul. 13, 1977), p. 750E77.
Patents Abstracts of Japan, vol. 6, No. 128(E-118)(1006) (Jul. 14, 1982).

*Primary Examiner*—Jin F. Ng
*Attorney, Agent, or Firm*—Oblon, Fisher, Spivak, McClelland & Maier

[57] ABSTRACT

In a microwave receiving apparatus using a waveguide filter, the waveguide filter is disposed in parallel to a microwave reception circuit board mounted in a shield container.

4 Claims, 5 Drawing Figures

F I G. 4A
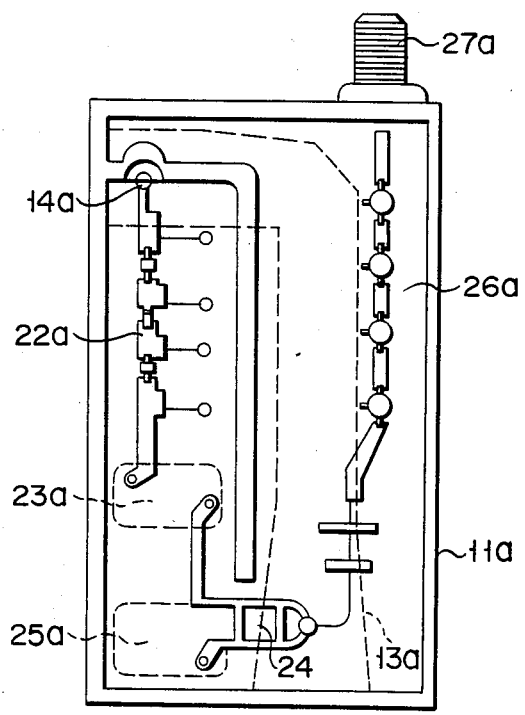
F I G. 4B
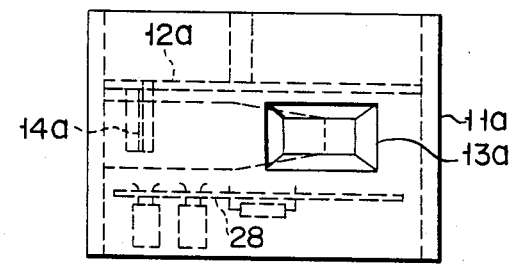

MICROWAVE RECEIVING APPARATUS USING A WAVEGUIDE FILTER

BACKGROUND OF THE INVENTION

This invention relates to a microwave receiving apparatus.

Recently, the development of a microwave transmitting and receiving system for transmitting and receiving high frequency signals such as the SHF band (e.g. 11.7–12.2 MHz) using a broadcasting satellite has been advanced. In the reception of such high frequency signals (hereinafter, referred to as microwaves), a remarkable amplification of the microwave is uneconomical. Generally, the microwave is first amplified by a low-noise and high-frequency amplifier, this microwave is converted into an intermediate frequency signal by a frequency converter using a mixer and a local oscilator whose oscillation frequency is lower than a reception signal, and thereafter this intermediate frequency signal is amplified. In this case, a image frequency signal is also converted into the intermediate frequency signal due to the frequency conversion process. Therefore, a band-pass filter is provided at the front stage of the frequency converter to suppress this image frequency signal. Such a band-pass filter is formed on a dielectric substrate as a microwave integrated circuit (MIC) by etching processes.

It is difficult to manufacture a large number of low-cost filters having low-loss and sharp characteristics taking account of a variation of filter elements in the etching processes. To solve this problem an image-rejection filter is also provided at the front stage of the high frequency amplifier. This filter is required to have a especially low-loss characteristic in order not to adversely affect the low-noise property of the high frequency amplifier. A waveguide filter is effective as a filter to meet such requirements.

FIG. 1 shows an outside appearance of a conventional microwave receiving apparatus using a waveguide filter. In the figure, a reference numeral 1 denotes a waveguide filter; 2 a receiving circuit board which constitutes a radio frequency amplifier, band-pass filter, frequency converter, and intermediate frequency amplifier; 3 a shield container for housing this receiving circuit board; and 4 an output terminal. This microwave receiving apparatus is generally installed outdoors as an outdoor unit together with an antenna (parabolic antenna).

The microwave receiving apparatus shown in FIG. 1 is difficult to be supported since its dimensions are large and its weight is large. To firmly support the apparatus, a heavy supporting member must be used, causing an increase in weight of the antenna. That is to say, this makes it difficult to install the antenna. As shown in FIG. 1, the attachment of the waveguide to the shield container results in an increase in length of the microwave receiving apparatus, so that the apparatus will be easily vibrated due to a wind or the like. When the receiving apparatus vibrates, the location of an input section 5 of the waveguide filter 1 changes. Thus, the radio waves received by the antenna are not correctly transmitted to the input section 5 of the waveguide filter 1, causing a deterioration of the receiving state.

In addition, a conventional microwave receiving apparatus requires three-stage connections of a primary reflector of an antenna, waveguide filter and receiving circuit, so that it includes problems on the alignment, attachment, or the like.

SUMMARY OF THE INVENTION

It is an object of the present invention to provide a small-sized and light-weighted microwave receiving apparatus using a waveguide filter in which the position of the receiving point is difficult to change and, therefore, it has a good receiving performance.

The above object of the present invention is accomplished by, in a microwave receiving apparatus using a waveguide filter, placing the waveguide filter with a receiving circuit board having a frequency converter and the like.

With such a construction, an overall length of the receiving apparatus can be reduced. Moreover, since the waveguide filter can be disposed in the remaining space in a housing for the receiving circuit board, it is not necessary to commonly use the waveguide filter as a supporting component of the receiving apparatus, so that the waveguide filter can be formed more thinly than in the case of a conventional apparatus. Namely, a light-weighted waveguide filter can be formed. Consequently, a small and light-weighted receiving apparatus can be realized, so that it is firm against the vibration and the position of the receiving point is difficult to change. Furthermore, if the waveguide filter is provided in contact relation with a ground plane of the receiving circuit board, it is possible to allow the waveguide to act as a heat sink of the receiving circuit board, resulting in a reduction of thermal noise.

BRIEF DESCRIPTION OF THE DRAWINGS

FIGS. 4A and 4B respectively illustrate a top plain view and a front view of a microwave receiving apparatus according to another embodiment of the present invention.

DETAILED DESCRIPTION OF THE PREFERRED EMBODIMENTS

Figure 1:
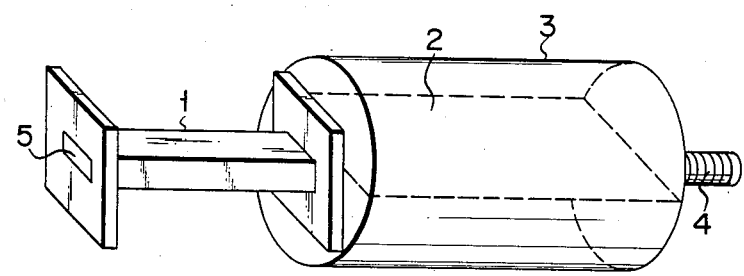
FIG. 1 is a perspective view of a conventional microwave receiving apparatus using a waveguide filter.
Figure 2:
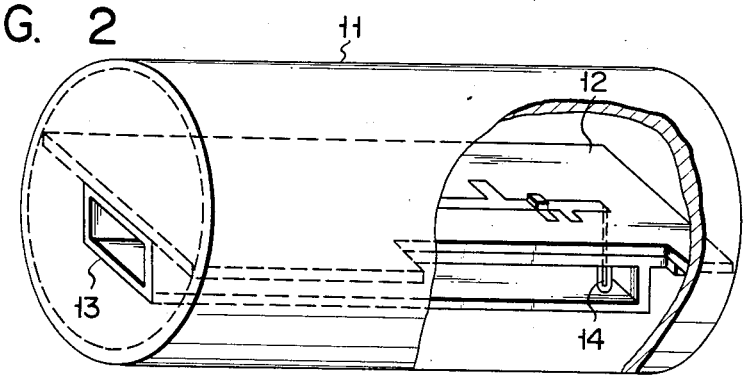
FIG. 2 is a partly-cut perspective view of a microwave receiving apparatus according to an embodiment of the present invention.

FIG. 2 schematically illustrates a construction of a microwave receiving apparatus embodying the present invention. As shown, a microwave integrated circuit board 12 on the top surface of which a receiving circuit including a frequency converter and the like is arranged is provided in a cylindrical shield container 11. A waveguide filter 13 is positioned with the under surface of the circuit board 12. To reduce the insertion loss in the reception signal frequency and to sufficiently suppress the image frequency signal, the dimensions of this waveguide filter 13 are designed in such a manner that a high frequency transmission characteristic is obtained in which the cut-off frequency is lower than the reception signal frequency and is higher than the image frequency.

The microwave integrated circuit board 12 has a construction such that a microstrip line and microwave semiconductor devices and the like are formed on a dielectric substrate. The under surface of the dielectric substrate is formed as a ground plane. In this embodiment, the waveguide 13 is arranged so as to come into contact with the ground plane of the circuit board 12. An output of the waveguide filter 13 is connected to the microwave integrated circuit through a waveguide-microstrip transmission mode converter 14 consisting of a coaxial line. Both ends of the shield container 11 are closed with the exception of the input section of the waveguide 13.

Figure 3:
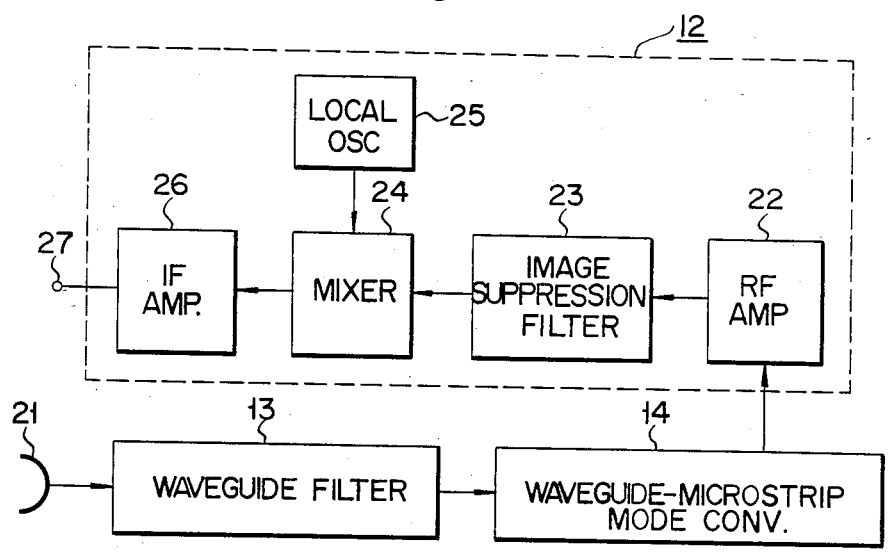
FIG. 3 is a block diagram of the microwave receiving apparatus.

The microwave integrated circuit is constituted as shown in FIG. 3. The signal received by a parabolic antenna 21 propagates in the waveguide filter 13 in the waveguide transmission mode and is introduced to the waveguide-microstrip transmission mode converter 14. Thereafter this signal is transmitted to an output terminal 27 in the microstrip transmission mode through a high frequency amplifier 22, image suppression filter 23, mixer 24, and intermediate frequency amplifier 26. A local oscillator 25 is coupled to the mixer 24.

The receiving apparatus to be installed outdoors is usually housed in a cylindrical container 11 as shown in FIG. 2 to reduce the resistance against a wind. Since the circuits other than the waveguide filter 13 are arranged on a plane as a microwave integrated circuit as described above, a large vain space remains in the container 11. In this embodiment, the waveguide 13 is housed in the container 11 using this space, so that an entire length of the apparatus can be shortened than a conventional apparatus. Therefore, the receiving apparatus of the present invention is firm against the vibration and this reduces the variation of the receiving point. In addition, in this embodiment, the waveguide 13 is in contact with the ground plane of the circuit board 12 and, accordingly, it can act as a heat sink of the circuit board, causing a thermal noise of the circuit to be reduced. In a conventional apparatus, the radio waves and the like reflected by the antenna enter the container 3 from a junction between a flange of the waveguide 1 and the container 3, so that it may cause a reception disturbance. On the other hand, in the receiving apparatus of the present invention, since the circuit is shielded by the container 11 excluding the input section of the waveguide 13, the radio waves reflected by the antenna securely enter the waveguide 13. Therefore, such a reception disturbance as in a conventional apparatus can be prevented.

Although waveguide filters are generally heavy and expensive, according to the receiving apparatus of the present invention in which the waveguide is disposed in the container, the waveguide can be formed integrally with the container as a part thereof using an aluminum die casting or a metalized plastic. With such a construction, it is not necessary to firmly construct the waveguide itself, so that it can be cheaply manufactured in large quantities.

FIGS. 4A and 4B illustrate a microwave receiving apparatus according to another embodiment of the present invention in which the waveguide is formed integrally with the container as a part thereof. In this embodiment, a rectangular container is used. FIG. 4A shows a top plan view of the receiving apparatus in which upper and lower covers of the container are removed and FIG. 4B shows a front view of the same. In FIGS. 4A and 4B, the parts and components corresponding to those in FIGS. 2 and 3 are designated by the same reference numerals with suffix a added to each numeral. In this embodiment, a waveguide filter 13a is formed integrally with container 11a made of an aluminum die casting or a metalized plastic. A microwave integrated circuit 12a is juxtaposed, in the container 11a, to the waveguide 13a. A high frequency amplifier 22a, image suppression filter 23a, mixer 24a, local oscillator 25a and intermediate frequency amplifier 26a are arranged on the circuit 12a. A reference numeral 28 denotes a power supply section.

What is claimed is:

1. A microwave signal receiving apparatus comprising:
   a wave guide filter for receiving a microwave signal by an input section and suppressing an image frequency signal component in the microwave signal, said wave guide filter having such a dimension that its cut-off frequency is higher than an image frequency and lower than a desired microwave signal frequency;
   a receiving circuit board on which a receiving circuit for amplifying an output signal of said wave guide filter and then converting it to an intermediate frequency signal is arranged; and
   a shield case for housing said wave guide filter and said receiving circuit board, said shield case being sealed at both ends thereof except said input section of said wave guide filter, said wave guide filter and said receiving circuit board being positioned one on top of the other in said shield case in a direction perpendicular to the ends of said shield case.

2. The apparatus according to claim 1, wherein said receiving circuit board is formed to have a ground plane and disposed on said wave guide filter such that said ground plane is in contact with said wave guide filter.

3. The apparatus according to claim 1, wherein said wave guide filter and said receiving circuit board are coupled by a wave guide-microstrip transmission mode converter.

4. The apparatus according to claim 1, wherein said wave guide filter is formed integrally with said shield case.

* * * * *